(12) United States Patent
Ferianz

(10) Patent No.: US 6,522,179 B2
(45) Date of Patent: Feb. 18, 2003

(54) DIFFERENTIAL LINE DRIVER CIRCUIT

(75) Inventor: Thomas Ferianz, Glamegg (AT)

(73) Assignee: Infineon, AG, Munich (DE)

( * ) Notice: Subject to any disclaimer, the term of this patent is extended or adjusted under 35 U.S.C. 154(b) by 0 days.

(21) Appl. No.: 09/953,339

(22) Filed: Sep. 14, 2001

(65) Prior Publication Data

US 2002/0070770 A1 Jun. 13, 2002

(30) Foreign Application Priority Data

Sep. 15, 2000 (DE) .......................... 100 45 720

(51) Int. Cl.$^7$ ................................. H03B 1/00
(52) U.S. Cl. .................. 327/108; 327/379; 326/30; 326/86
(58) Field of Search ............ 327/108, 65, 67, 327/379, 560, 109, 110, 111, 112; 326/30, 82, 86; 330/69

(56) References Cited

U.S. PATENT DOCUMENTS

| | | | |
|---|---|---|---|
| 5,614,864 A | * 3/1997 | Stubbe et al. ................ | 330/69 |
| 5,856,758 A | 1/1999 | Joffe et al. .................... | 330/85 |
| 6,100,717 A | * 8/2000 | May ............................. | 326/83 |
| 6,316,970 B1 | * 11/2001 | Hebert ......................... | 327/67 |

OTHER PUBLICATIONS

Tietze, U; Schenk, Ch; "Halbleiter–Schaltungstechnik"©*Spring–Verlag* Heidelberg, pp. 818, 819, 827 (1999).

* cited by examiner

*Primary Examiner*—Terry D. Cunningham
*Assistant Examiner*—Long Nguyen
(74) *Attorney, Agent, or Firm*—Fish & Richardson P.C.

(57) ABSTRACT

A differential line driver circuit having an output impedance matched to the line impedance includes first and second input terminals for the application of an input signal, a fully differential operational amplifier having inverting and non-inverting signal inputs connected to first and second input terminals respectively, first and second signal outputs providing in-phase and quadrature amplified output signals, and gain adjusting impedances connected between the input terminals and the amplifier's signal inputs. First and second feedback impedances connect between inverting and non-inverting signal inputs of the amplifier and its first and second signal outputs. First and second matching impedances connect first and second amplifier outputs to corresponding output terminals of the line-driver circuit. First and second positive-feedback impedances connect the first and second output terminals of the line driver circuit to the non-inverting and inverting inputs of the amplifier.

12 Claims, 2 Drawing Sheets

DIFFERENTIAL LINE DRIVER CIRCUIT

FIELD OF INVENTION

The invention relates to a differential line driver circuit with a fully differential operational amplifier for driving a line signal output via a signal line.

RELATED APPLICATIONS

This application claims the priority date of German patent application DE 100 45 720.7, filed on Sep. 15, 2000, the contents of which are herein incorporated by reference.

BACKGROUND

FIG. 1 shows a differential line driver circuit having a fully differential operational amplifier according to the prior art. The line driver circuit contains a fully differential operational amplifier OP having an inverting input (−), a non-inverting input (+), and a common mode signal input. The operational amplifier OP also has a first signal output (+) and a second signal output (−) that is in phase opposition therewith. The operational amplifier OP is supplied with voltage via a first supply voltage terminal having a positive supply voltage $V_{DD}$, and via a second supply voltage terminal having a negative supply voltage $V_{SS}$. The signal outputs of the operational amplifier OP are fed back to the signal inputs via feedback impedances $R_{RI}$, $R_{RII}$. The signal outputs of the operational amplifier OP are connected via matching impedances $R_{AI}$, $R_{AII}$ to output terminals A1, A2 of the line driver circuit. The signal inputs are connected via gain adjusting impedances $R_{E1}$, $R_{E2}$ to input terminals E1, E2 of the line driver circuit. An input signal to be amplified, which is amplified by the operational amplifier OP and is output via the output terminals A1, A2 to the signal line with the line resistance $Z_L$, is applied to the input terminals E1, E2.

The matching impedances $R_{AI}$, $R_{AII}$ are matched to the impedance $Z_L$ of the signal line in order to avoid signal reflections on the line.

It holds for the output impedance of the conventional line driver circuit shown in FIG. 1 that $$Z_{aus} = R_{AI} + R_{AII} = Z_L \quad (1)$$

Together with the impedance of the line, the matching impedances $R_{AI}$, $R_{AII}$ form a voltage divider such that the output voltage $U_{opaus}$ output by the differential operational amplifier OP must be twice as high as the output voltage $U_{aus}$ to be made available at the output terminals A1, A2 of the line driver. It holds that $$U_{opaus} = 2 \cdot U_{aus} \quad (2)$$

It holds for the supply voltage $U_{versorgung}$ of the operational amplifier that:

$$U_{versorgung} = V_{DD} - V_{SS} \quad (3)$$

The supply voltage $U_{versorgung}$ of the operational amplifier OP must always be higher than the output voltage $U_{opaus}$ output by the operational amplifier:

$$U_{versorgung} > U_{opaus} = 2 \cdot U_{aus} \quad (4)$$

In the conventional driver circuit, such as that shown in FIG. 1, the supply voltage $U_{versorgung}$ must be at least twice as high as the output voltage $U_{aus}$ of the driver circuit. The necessary supply voltage $U_{versorgung}$ is therefore relatively high. Because of the relatively high supply voltage, the conventional driver circuit illustrated in FIG. 1 consumes significant power.

It is therefore an object of the present invention to create a differential line driver circuit having a fully differential operational amplifier that requires a low supply voltage and has a low power loss.

SUMMARY

The invention creates a differential line driver circuit having a fully differential operational amplifier for the purpose of driving a line signal output via a signal line, having a first input terminal and a second input terminal for the application of an input signal, a fully differential operational amplifier that has an inverting signal input connected to the first input terminal, a non-inverting signal input connected to the second input terminal, a first signal output for outputting an amplified output signal in phase with the first input signal, and a second signal output for outputting an amplified output signal in phase opposition with the input signal.

Gain adjusting impedances provided in each case between an input terminal of the line driver circuit and a signal input of the operational amplifier, a first feedback impedance connected between the inverting signal input of the operational amplifier and the first signal output of the operational amplifier, a second feedback impedance connected between the non-inverting signal input of the operational amplifier and the second signal output of the operational amplifier, a first matching impedance connected between the first signal output of the operational amplifier and a first output terminal of the line driver circuit, a second output impedance, is connected between the second signal output of the operational amplifier and a second output terminal of the line driver circuit, the differential line driver circuit according to the invention additionally having a first positive feedback impedance connected between the first output terminal of the line driver circuit and the non-inverting input of the operational amplifier, and a second positive feedback impedance connected between the second output terminal of the line driver circuit and the inverting input of the operational amplifier, and the output impedance of the line driver circuit being matched to the impedance of the line.

The output impedance of the line driver circuit is preferably determined by the product of an output impedance synthesis factor and the sum of the impedances of the two matching impedances.

The output impedance synthesis factor can preferably be adjusted as a function of the positive feedback impedances and the feedback impedances.

In one embodiment of the differential line driver circuit according to the invention, the first positive feedback impedance and the second positive feedback impedance have the same impedance.

The first feedback impedance and the second feedback impedance likewise preferably have the same impedance.

The output impedance synthesis factor is preferably greater than one.

In a particularly preferred embodiment of the differential line driver circuit according to the invention, the output impedance synthesis factor is approximately five.

The differential line driver circuit according to the invention is preferably of fully symmetrical design.

The signal driven by the differential line driver circuit is preferably an xDSL signal.

In a particularly preferred embodiment, the adjusting impedances, the feedback impedances and the positive feedback impedances as well as the matching impedances are complex impedances.

The impedance values of the adjusting impedances, the feedback impedances, the positive feedback impedances and the matching impedances can preferably be switched over by switching devices.

The fully differential operational amplifier preferably has a common mode signal input.

These and other features and advantages of the invention will be apparent from the following detailed description and the accompanying drawings in which:

DETAILED DESCRIPTION

Figure 1:
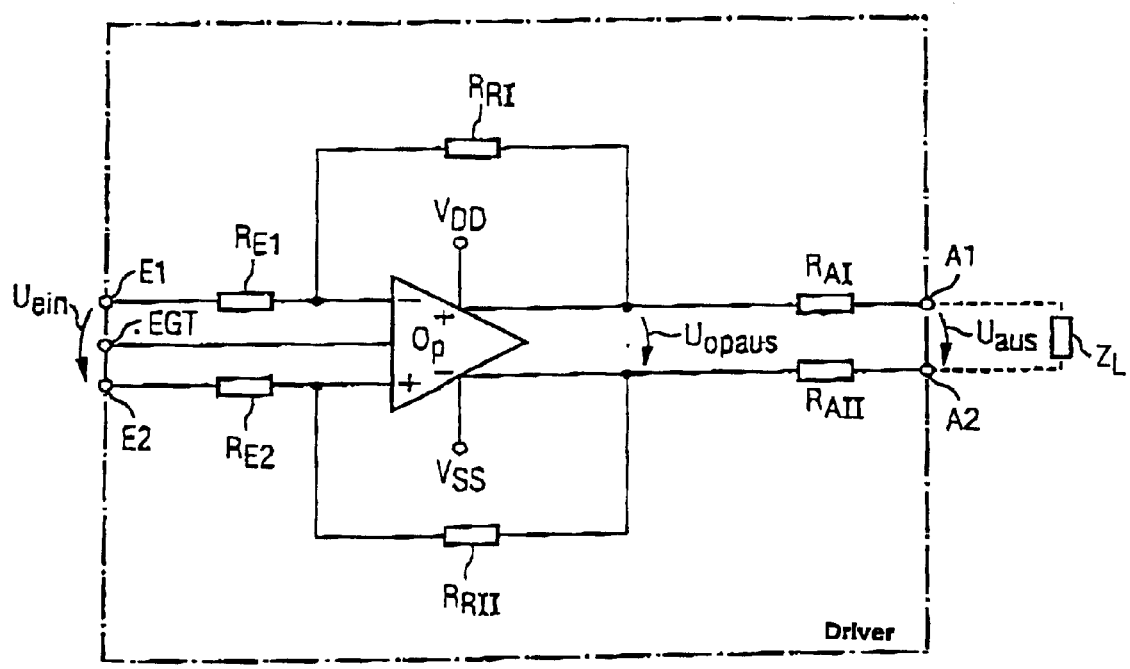
FIG. 1 shows a differential line driver circuit according to the prior art.
Figure 2:
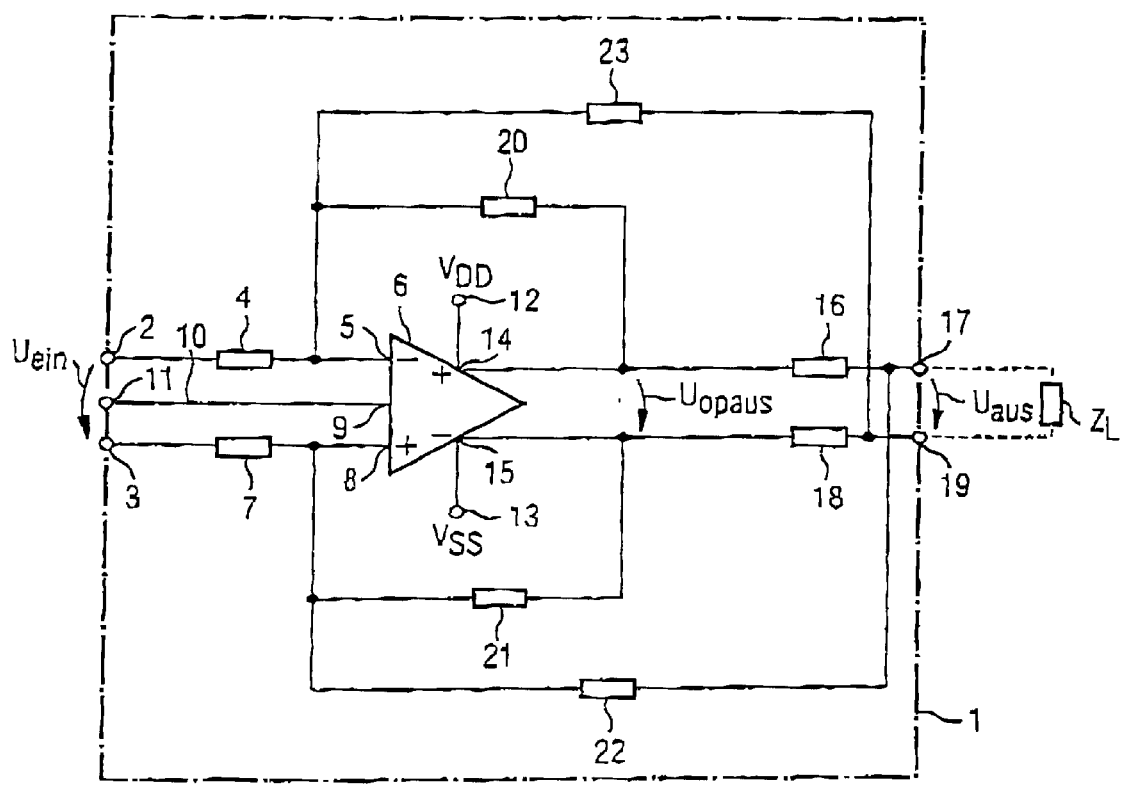
FIG. 2 shows a differential line driver circuit according to the invention.

As may be seen from FIG. 2, the differential line driver circuit 1 according to the invention includes a first input terminal 2 and a second input terminal 3 for the application of an input signal $U_{ein}$. The first input terminal 2 is connected via a first gain adjusting impedance 4 to the inverting signal input 5 of a fully-differential operational amplifier 6. The second input terminal 3 is connected via a first gain-adjusting impedance 7 to a non-inverting signal input 8 of the operational amplifier 6 of differential design. The operational amplifier 6 has, moreover, a common-mode signal input 9 connected via a line 10 to a common mode signal input 11 of the line driver circuit 1. The operational amplifier 6 is connected via a first supply voltage terminal 12 to a positive supply voltage $V_{DD}$, and via a second supply voltage terminal 13 to a negative supply voltage $V_{SS}$. The operational amplifier 6 further has an in-phase signal output 14 for outputting an amplified output signal that is in phase with the input signal $U_{ein}$, and an antiphase signal output 15 for outputting an amplified output signal that is in phase opposition with the input signal. The in-phase signal output 14 of the operational amplifier 6 is connected via a first line-matching impedance 16 to a first signal output terminal 17 of the line driver circuit 1. The antiphase signal output 15 of the operational amplifier 6 is connected via a second line-matching impedance 18 to a second output terminal 19 of the line driver circuit 1. The in-phase signal output 14 of the operational amplifier 6 is connected, furthermore, to the inverting signal input 5 of the operational amplifier 6 via a feedback impedance 20. The antiphase signal output 15 of the operational amplifier 6 of differential design is fed back to the non-inverting signal input 8 via a feedback impedance 21.

The first signal output terminal 17 is connected via a first positive-feedback impedance 22 to the non-inverting signal input 8 of the operational amplifier 6. The second signal output 19 of the line driver circuit 1 is connected via a further positive-feedback impedance 23 to the inverting signal input 5 of the operational amplifier 6. The line driver circuit 1 amplifies the input signal present at the first and second input terminals 2, 3 and outputs it in an amplified state via the first and second signal output terminals 17, 19 as an amplified output signal $U_{aus}$ to a connected signal line with the impedance $Z_L$.

Owing to the positive feedback via the first and second positive-feedback impedances 22, 23, an output impedance $Z_{aus}$ matched to the line impedance $Z_L$ is synthesized. In this case, the positive feedback signal for a signal input of the operational amplifier 6 is fed back in each case from the other antiphase amplifier output.

The inverting signal input 5 of the operational amplifier 6 receives a positive feedback signal from the antiphase signal output 15 via the second line-matching impedance 18 and the positive-feedback impedance 23.

The non-inverting signal input 8 of the operational amplifier 6 receives a positive feedback signal from the in-phase signal output 14 of the operational amplifier 6 via the first line-matching impedance 16 and the first positive-feedback impedance 22.

It holds for the output impedance $Z_{aus}$ of the differential line driver circuit 1 according to the invention illustrated in FIG. 2 that:

$$Z_{AUS} = m \cdot (Z_{16} + Z_8) \tag{5}$$

m being the output impedance synthesis factor, Z16 being the impedance of the first line-matching impedance 16, and $Z_{18}$ being the impedance of the second line-matching impedance 18.

The output impedance $Z_{AUS}$ of the line driver circuit 1 is matched to the impedance $Z_L$ of the line to be driven by means of the output impedance synthesis factor m:

$$Z_{AUS} = Z_L \tag{6}$$

The first and second gain-adjusting impedances 4, 7 preferably have the same impedance, that is to say it holds that:

$$Z_4 = Z_7 = Z_E \tag{7}$$

The feedback impedances 20, 21 likewise preferably have the same feedback impedance $Z_{RK}$:

$$Z_{20} = Z_{21} = Z_{RK} \tag{8}$$

The positive-feedback impedances preferably likewise have the same positive-feedback impedance $Z_{MK}$:

$$Z_{22} = Z_{23} = Z_{MK} \tag{9}$$

The output impedance synthesis factor m is adjusted as a function of the positive-feedback impedances 22, 23 and the feedback impedances 20, 21.

The output impedance synthesis factor m depends on the positive-feedback impedance $Z_{MK}$ and the feedback impedance $Z_{RK}$ in the following way:

$$m = \frac{Z_{MK}}{Z_{MK} - Z_{RK}} \tag{10}$$

The higher the output impedance synthesis factor m is adjusted, the smaller is the requisite sum of the impedances $Z_{16}$, $Z_{18}$ of the first and second line-matching impedances 16, 18 for the purpose of achieving an output impedance of the line driver circuit 1 that is matched to the line impedance $Z_L$.

It holds for the output voltage $U_{opaus}$ of the operational amplifier 6 between the in-phase and antiphase signal outputs 14, 15 of the operational amplifier that:

$$U_{opaus} = (1+1/m) \, U_{aus} \qquad (11)$$

The higher the output impedance synthesis factor m is adjusted, the lower is the requisite output voltage $U_{opaus}$ to be made available by the operational amplifier 6, and the lower therefore also is the supply voltage $U_{versorgung}$ to be made available for the operational amplifier 6.

The value of the output impedance synthesis factor m is bounded above, for a prescribed minimum accuracy of the total output impedance $Z_{AUS}$, by the strongly rising tolerance demands made on the impedances $Z_E, Z_{RK}, Z_{MK}$. The result for an output impedance synthesis factor m=5 is already 80% of the maximum possible reduction in output signal level, which is 50%, that is to say the output level reduction is 40%. The output impedance synthesis factor m is therefore adjusted preferably to approximately 5. Given an output synthesis factor m=5, the line driver circuit 1 according to the invention and as illustrated in FIG. 2 requires at the in-phase and antiphase signal outputs 14, 15 of the differential operational amplifier 6 only 12 volts (peak-to-peak) in order to permit an output line level $U_{AUS}$ of 10 volts (peak-to-peak). The supply voltage $U_{versorgung}$ of the operational amplifier 6 is approximately 17 volts in this case.

The power loss $P_r$ of the line driver circuit 1 according to the invention is likewise slight because of the low requisite supply voltage $U_{versorgung}$.

The impedances of the first and second line-matching impedances 16, 18 are generally substantially lower than the adjusting impedances $Z_E$, the feedback impedance $Z_{RK}$ and the positive-feedback impedance $Z_{MK}$. It therefore holds for the open-circuit gain ($Z_L = \alpha$) of the line driver circuit 1 that:

$$G = \frac{1}{Z_E} \cdot \frac{Z_{RK} \cdot Z_{MK}}{Z_{MK} - Z_{RK}} \qquad (12)$$

The result for the open-circuit gain G of the differential line driver circuit 1 according to the invention with equation (10) is:

$$G = m \cdot \frac{Z_{RK}}{Z_E} \qquad (13)$$

The first and second line-matching impedances 16, 18 are preferably at the same level:

$$Z_{16} = Z_{18} = Z_A \qquad (14)$$

The result for the total output impedance of the differential line driver circuit 1 is therefore:

$$Z_{AUS} = 2 \cdot m \cdot Z_A = 2 \cdot \frac{Z_{MK}}{Z_{MK} \div Z_{RK}} \cdot Z_A \qquad (15)$$

The line driver circuit 1 according to the invention has the advantage that the output common mode voltage can be adjusted independently of the input common mode voltage via the common mode signal input 11. There is no need, therefore, for signal level-shifting circuits for matching different common mode voltage levels between the output of a drive circuit and the output of the line driver circuit 1 according to the invention.

In a preferred embodiment, the first and second gain-adjusting impedances 4, 7, the feedback impedances 20, 21, the positive-feedback impedances 22, 23 and the first and second line-matching impedances 16, 18 are complex impedances for synthesizing a complex output impedance $Z_{aus}$ of the line driver circuit 1. It is possible thereby for the output impedance $Z_{AUS}$ of the line driver circuit 1 to be matched with particular accuracy to the complex impedance $Z_L$ of the line. In the case of a particularly preferred embodiment of the differential line driver circuit according to the invention, in this case, the impedance values of the first and second gain-adjusting impedances 4, 7, of the feedback impedances 20, 21, of the positive-feedback impedances 22, 23, and of the first and second line-matching impedances 16, 18 can be switched over between different values via switching devices. As a result, the synthesized output impedance $Z_{AUS}$ of the differential line driver circuit 1 can be programmed adaptively in such a way that the complex output impedance $Z_{AUS}$ of the line driver circuit 1 is matched accurately to the complex impedance $Z_L$ of the line by driving the switching devices. By tapping the positive-feedback signal from the respective other antiphase operational amplifier output, a positive feedback is achieved by means of which an output impedance $Z_{AUS}$ is synthesized with the aid of only one operational amplifier 6.

I claim:

1. A differential line driver circuit for driving a line signal output via a signal line, said circuit comprising:
    a first input terminal and a second input terminal for the application of an input signal,
    a fully differential operational amplifier having
        an inverting signal input connected to the first input terminal,
        a non-inverting signal input connected to the second input terminal,
        a first signal output for providing an amplified output signal in phase with the input signal, and
        a second signal output for providing an amplified output signal in phase opposition with the input signal,
    gain adjusting impedances for adjusting the gain of the differential line driver circuit, the gain adjusting impedances being connected between an input terminal of the line driver circuit and a signal input of the operational amplifier,
    a first feedback impedance connected between the inverting signal input of the operational amplifier and the first signal output of the operational amplifier,
    a second feedback impedance connected between the non-inverting signal input of the operational amplifier and the second signal output of the operational amplifier,
    a first matching impedance connected between the first signal output of the operational amplifier and a first output terminal of the line driver circuit, and
    a second matching impedance connected between the second signal output of the operational amplifier and a second output terminal of the line driver circuit,
    a first positive-feedback impedance connected between the first output terminal of the line driver circuit and the non-inverting signal input of the operational amplifier, and
    a second positive-feedback impedance, connected between the second output terminal of the line driver circuit and the inverting input of the operational amplifier,
    the output impedance of the line driver circuit being matched to the impedance of the line.

2. The differential line driver circuit as claimed in claim 1, wherein the output impedance is determined by the product of an output impedance synthesis factor and a sum of the impedances of the two matching impedances.

3. The differential line driver circuit as claimed in claim 2, wherein the output impedance synthesis factor is adjustable as a function of the positive-feedback impedances and the feedback impedances.

4. The differential line driver circuit as claimed in claim 1, wherein the first positive feedback impedance and the second positive feedback impedance have the same impedance.

5. The differential line driver circuit as claimed in claim 1, wherein the first feedback impedance and the second feedback impedance have the same impedance.

6. The differential line driver circuit as claimed in claim 2, wherein the output impedance synthesis factor is greater than one.

7. The differential line driver circuit as claimed in claim 6, wherein the output impedance synthesis factor is approximately five.

8. The differential line driver circuit as claimed in claim 1, wherein the line driver circuit is fully symmetrical.

9. The differential line driver circuit as claimed in claim 1, wherein the line signal is an xDSL signal.

10. The differential line driver circuit as claimed in claim 1, wherein at least one impedance selected from the group consisting of the gain adjusting impedances, the feedback impedances, the positive feedback impedances, and the matching impedances is a complex impedance.

11. The differential line driver circuit as claimed in one of the preceding claims, wherein the impedance values of at least one impedance selected from the group consisting of the matching impedances, the feedback impedances, the positive feedback impedances, and the adjusting impedances are switched over by switching devices.

12. The differential line driver circuit as claimed in claim 1, wherein the fully differential operational amplifier further comprises a common mode signal input.

* * * * *